United States Patent
Yu et al.

(10) Patent No.: US 11,935,927 B2
(45) Date of Patent: Mar. 19, 2024

(54) BIPOLAR TRANSISTOR WITH COLLECTOR CONTACT

(71) Applicant: GLOBALFOUNDRIES U.S. Inc., Malta, NY (US)

(72) Inventors: Hong Yu, Clifton Park, NY (US); Vibhor Jain, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 24 days.

(21) Appl. No.: 17/684,321

(22) Filed: Mar. 1, 2022

(65) Prior Publication Data
US 2023/0143396 A1 May 11, 2023

Related U.S. Application Data

(60) Provisional application No. 63/277,810, filed on Nov. 10, 2021.

(51) Int. Cl.
| | | |
|---|---|---|
| *H01L 29/417* | (2006.01) | |
| *H01L 29/08* | (2006.01) | |
| *H01L 29/10* | (2006.01) | |
| *H01L 29/66* | (2006.01) | |
| *H01L 29/735* | (2006.01) | |
| *H01L 29/737* | (2006.01) | |

(52) U.S. Cl.
CPC .... *H01L 29/41708* (2013.01); *H01L 29/0821* (2013.01); *H01L 29/1008* (2013.01); *H01L 29/66242* (2013.01); *H01L 29/735* (2013.01); *H01L 29/737* (2013.01); *H01L 29/0808* (2013.01); *H01L 29/0817* (2013.01)

(58) Field of Classification Search
CPC .......... H01L 29/41708; H01L 29/0821; H01L 29/1008; H01L 29/66242; H01L 29/735; H01L 29/0808; H01L 29/0817
See application file for complete search history.

(56) References Cited

U.S. PATENT DOCUMENTS

| | | |
|---|---|---|
| 6,940,149 B1 | 9/2005 | Divakaruni et al. |
| 6,949,764 B2 | 9/2005 | Ning |
| 8,288,758 B2 | 10/2012 | Ning et al. |
| 8,420,493 B2 | 4/2013 | Ning et al. |
| 8,586,441 B1 | 11/2013 | Cai et al. |
| 9,530,711 B2 | 12/2016 | Botula et al. |

(Continued)

FOREIGN PATENT DOCUMENTS

| | | |
|---|---|---|
| WO | 2018031175 | 2/2018 |

OTHER PUBLICATIONS

Search Report in related EP Application No. 22200481.4-1212 dated Apr. 12, 2023, 11 pages.

(Continued)

*Primary Examiner* — Syed I Gheyas
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to a bipolar transistor with a collector contact and methods of manufacture. The structure includes: a lateral bipolar transistor which includes an emitter, a base and a collector; an emitter contact to the emitter; a base contact to the base; and a collector contact to the collector and extending to an underlying substrate underneath the collector.

20 Claims, 8 Drawing Sheets

(56) References Cited

U.S. PATENT DOCUMENTS

| | | | |
|---|---|---|---|
| 9,536,788 | B1 | 1/2017 | Ning et al. |
| 10,825,921 | B2 | 11/2020 | Balakrishnan et al. |
| 2004/0023463 | A1 | 2/2004 | Shirakawa |
| 2007/0275533 | A1 | 11/2007 | Vaed et al. |
| 2015/0263091 | A1 | 9/2015 | Hashemi et al. |
| 2016/0064484 | A1* | 3/2016 | Harame .............. H01L 29/1004 257/163 |
| 2019/0386121 | A1 | 12/2019 | Goktepeli et al. |
| 2020/0013884 | A1 | 1/2020 | Goktepeli et al. |

OTHER PUBLICATIONS

John et al., "Optimization of a SiGe:C HBT in a BiCMOS Technology for Low Power Wireless Applications", Digital DNATM Laboratories, Semiconductor Products Sector, Motorola Inc, Tempe AZ, +Berlin, Germany. Date uploaded Feb. 28, 2022.

Thibeault et al., "A study of ultra-high performance SiGe HBT devices on SOI", IEEE, 2013, Abstract, 1 page.

Jain et al., "Study of mutual and self-thermal resistance in 90nm SiGe HBTs" IEEE, 2013, Abstract, 2 pages.

U.S. Appl. No. 17/511,613, filed Oct. 27, 2021, 43 pages.

U.S. Appl. No. 17/525,236, filed Nov. 12, 2021, 21 pages.

U.S. Appl. No. 17/578,011, filed Jan. 18, 2022, 34 pages.

Jefy A. Jayamon et al., "Multigate-Cell Stacked FET Design for Millimeter-Wave CMOS Power Amplifiers," IEEE Journal of Solid-State Circuits, vol. 51, No. 9, Sep. 2016, 2027-2039.

* cited by examiner

BIPOLAR TRANSISTOR WITH COLLECTOR CONTACT

BACKGROUND

The present disclosure relates to semiconductor structures and, more particularly, to a bipolar transistor with a collector contact and methods of manufacture.

Bipolar transistors can be vertical transistors or lateral transistors. Lateral bipolar junction transistors may be used in many different applications such as automotive applications. These devices can attain very high Ft (current gain cut-off frequency) and high Fmax (power gain cut off frequency) values compared to CMOS. In advanced nodes, though, as contact size shrinks, emitter resistance (Re) and collector resistance (Rc) increase as does the collector capacitance (Cbc). This negatively impacts Ft/Fmax.

SUMMARY

In an aspect of the disclosure, a structure comprises: a lateral bipolar transistor comprising an emitter, a base and a collector; an emitter contact to the emitter; a base contact to the base; and a collector contact to the collector and extending to an underlying substrate underneath the collector.

In an aspect of the disclosure, a structure comprises: a substrate comprising a handle substrate, an insulator material on the handle substrate and a semiconductor material on the insulator material; a lateral bipolar transistor comprising a collector, an emitter and a base; an emitter contact to the emitter; a base contact to the base; and a collector contact to the collector and extending to the handle substrate, through the insulator material and the semiconductor material.

In an aspect of the disclosure, a method comprises: forming a lateral bipolar transistor comprising an emitter, a base and a collector; an emitter contact to the emitter; a base contact to the base; and forming a collector contact to the collector and extending to an underlying substrate underneath the collector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a bipolar transistor with a collector contact and methods of manufacture. More specifically, the present disclosure relates to a collector contact for a heterojunction bipolar transistor within a single diffusion break and that contacts to the underlying substrate. Advantageously, the collector contact provides improved thermal conduction, e.g., provides an improved thermal dissipation pathway for the heterojunction bipolar transistor (i.e., improved bipolar thermal resistance (Rth)). In addition, by implementing the different aspects of the present disclosure, e.g., collector contact, it is possible to provide a reduction in contact resistance (Rc) of more than 50% and, hence improved Ft, compared to conventional structures.

In more specific embodiments, the heterojunction bipolar transistor may be a lateral heterojunction bipolar transistor. The lateral heterojunction bipolar transistor may include a collector contact landing on both a collector silicide and a substrate (e.g., handle wafer or substrate). The collector contact may be isolated by spacers which surround the collector contact and extend within the substrate. In embodiments, the spacers may extend through a buried insulator layer. In further embodiments, the collector contact wraps around with a raised collector region, e.g., epitaxial semiconductor material and silicide. The collector contact may extend through a portion of a dummy gate structure which includes a second spacer formed around the spacers.

The lateral heterojunction bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral heterojunction bipolar transistor of the present disclosure have been adopted from integrated circuit (IC) technology. For example, the structures are built on wafers and are realized in films of material patterned by photolithographic processes on the top of a wafer. In particular, the fabrication of the lateral heterojunction bipolar transistor uses three basic building blocks: (i) deposition of thin films of material on a substrate, (ii) applying a patterned mask on top of the films by photolithographic imaging, and (iii) etching the films selectively to the mask. In addition, pre-cleaning processes may be used to clean etched surfaces of any contaminants, as is known in the art. Moreover, when necessary, rapid thermal anneal processes may be used to drive-in dopants or material layers as is known in the art.

Figure 1:
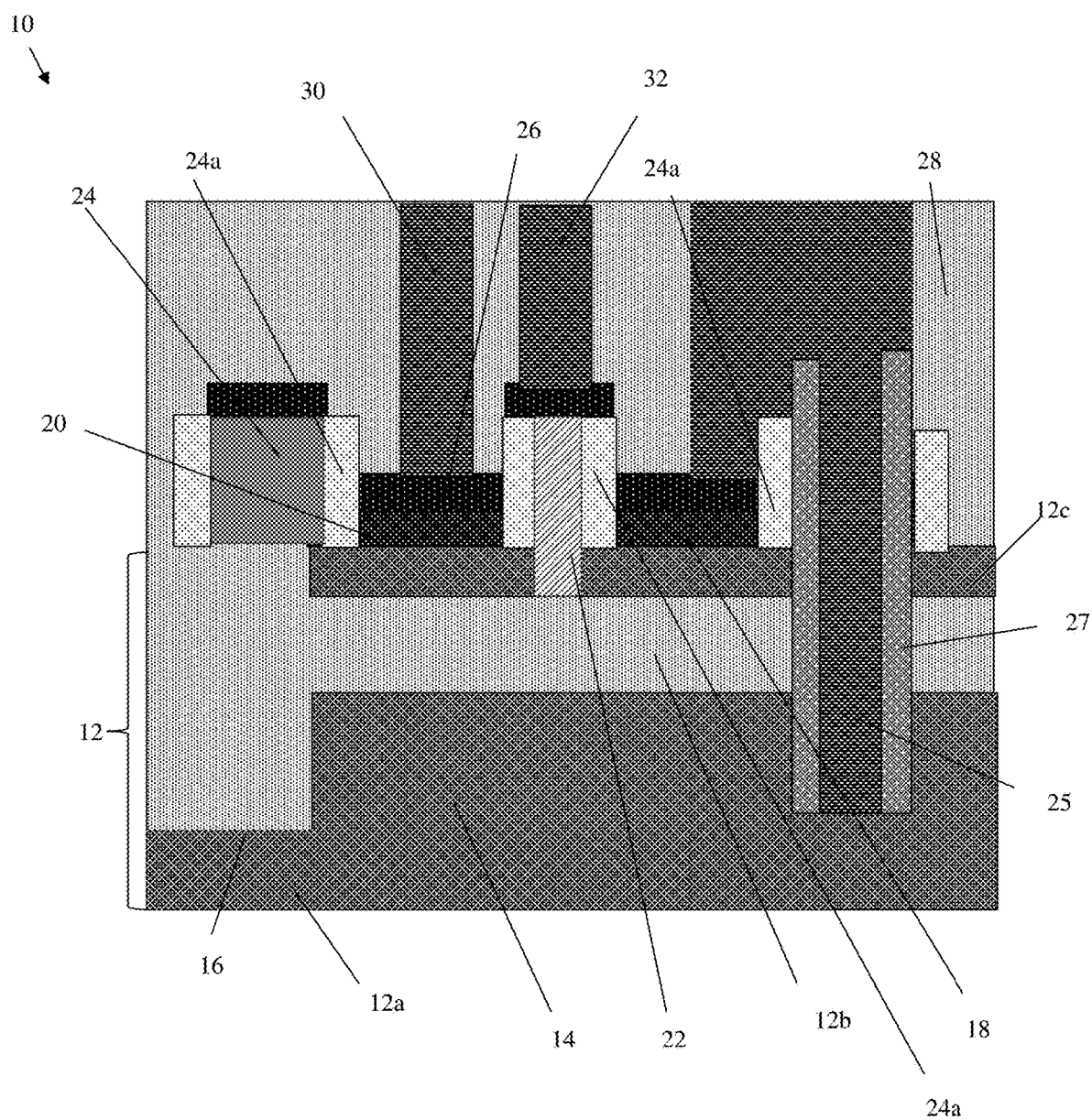
FIG. 1 shows a lateral heterojunction bipolar transistor and respective fabrication processes in accordance with aspects of the present disclosure.

FIG. 1 shows a lateral heterojunction bipolar transistor in accordance with aspects of the present disclosure. In particular, the lateral heterojunction bipolar transistor 10 includes a substrate 12. In embodiments, the substrate 12 may include a handle wafer (substrate) 12a, a buried insulator material 12b over the handle wafer 12a, and a semiconductor substrate 12c over the buried insulator material 12b. The handle wafer 12a provides mechanical support to the buried insulator layer 12b and the semiconductor substrate 12c.

In embodiments, the handle wafer (substrate) 12a and the semiconductor substrate 12c may include any appropriate semiconductor material such as, for example, Si, SiGe, SiGeC, SiC, GE alloys, GaAs, InAs, InP, and other III/V or II/VI compound semiconductors or any combinations thereof. The semiconductor substrate 12c may also comprise any suitable crystallographic orientation (e.g., a (100), (110), (111), or (001) crystallographic orientation). The buried insulator layer 12b may include a dielectric material such as silicon dioxide, silicon nitride, silicon oxynitride, boron nitride or a combination thereof. An exemplary insulator layer may be a buried oxide layer (BOX).

Still referring to FIG. 1, the handle wafer 12a may be a P-substrate with an N-well 14. The semiconductor substrate 12c may also comprise an n-type substrate. The N-well 14 may act as a contact (e.g., subcollector) for a collector and may be provided by a deep ion implantation process; whereas n-type dopants in the semiconductor substrate 12c may be provided by a shallow ion implantation process.

As should be known to those of skill in the art, the ion implantation process includes introducing a certain concentration of dopant by, for example, ion implantation. In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The N-well 14 and semiconductor substrate 12c may be doped with n-type dopants, e.g., Arsenic (As), Phosphorus (P) and Sb, among other suitable examples.

A deep trench isolation structure 16 may be provided in the substrate 12. In embodiments, the deep trench isolation structure 16 extends into the handle wafer 12a, e.g., contacts the subcollector region in the handle wafer 12a. The deep trench isolation structure 16 may be formed by conventional lithography, etching and deposition methods known to those of skill in the art. For example, a resist formed over the semiconductor substrate 12c is exposed to energy (light) to form a pattern (opening). An etching process with a selective chemistry, e.g., reactive ion etching (RIE), will be used to transfer the pattern from the resist layer to the semiconductor substrate 12c to form one or more trenches in the semiconductor substrate 12c. Following the resist removal by a conventional oxygen ashing process or other known stripants, insulator material (e.g., oxide) can be deposited by any conventional deposition processes, e.g., chemical vapor deposition (CVD) processes. Any residual material on the surface of the semiconductor substrate 12c can be removed by conventional chemical mechanical polishing (CMP) processes.

A collector 18, an emitter 20 and a base 22 may be formed over the semiconductor substrate 12c. In embodiments, the collector 18 and the emitter 20 may be a raised collector 18 and a raised emitter 20 formed by epitaxial growth processes starting on the semiconductor substrate 12c. For example, the raised collector 18 and the raised emitter 20 may be formed by growing semiconductor material, e.g., Si material, directly on the semiconductor substrate 12c. The base 22 may be formed in contact with the underlying semiconductor substrate 12c, optionally extending to the buried insulator layer 12b. In embodiments, the base 22 may be fabricated by forming a trench into the semiconductor substrate 12c using conventional lithography and etching processes as described herein. The trench may optionally extend to the buried insulator layer 12b. Following the trench formation, an epitaxial growth process using, e.g., SiGe material, may be used to form the base 22. In this way, the base 22 may be a raised base. In embodiments, the raised collector 18, the raised emitter 20 and the raised base 22 may comprise Si/SiGe/Si, all SiGe or all Si, as further examples.

The structure 10 may also include dummy gate structures 24, one of which may be removed to form a collector contact 25 extending to and contacting the handle wafer 12a. The collector contact 25 may have a greater width dimension than the emitter contact 30 and the base contact 32, and may increase the contact surface area to the handle wafer 12a to provide an improved heat conduction or passageway for heat transfer away from the bipolar heterojunction bipolar transistor. The formation of the collector contact 25 is described in more detail with respect to FIGS. 3A-3F.

In embodiments, the dummy gate structures 24 may be polysilicon material formed by conventional deposition processes, e.g., CVD, followed by a patterning process as is known in the art. In embodiments, a sidewall spacer 24a may be formed on sidewalls of the dummy gate structures 24, in addition to the base 22. The sidewall spacers 24a may be oxide and/or nitride material deposited by a conventional deposition method, e.g., CVD, followed by an etching process known to those of skill in the art such that no further explanation is required for a complete understanding of the present disclosure. In embodiments, the material of the sidewall spacers on top of the dummy gate structures 24 may be removed during a single diffusion break cut process as described below. The sidewall spacer 24a that surrounds the base 22 will isolate the base 22 from the collector 18 and the emitter 20.

The collector contact 25 may be formed between the sidewall spacers 24a of the removed dummy gate structure as described with respect to FIGS. 3A-3F. In embodiments, the collector contact 25 may also include sidewall spacers 27, between the sidewall spacers 24a of the removed dummy gate structure. At least one dummy gate structure 24 may be formed partially over the deep trench isolation structure 16 and the semiconductor substrate 12c. The sidewall spacers 27 may extend to the handle wafer 12a, underneath the bipolar transistor, e.g., collector 18, the emitter 20 and the base 22.

The collector 18, the emitter 20 and the base 22 may be subjected to a silicide process to form silicide contacts 26, prior to the formation of the respective contacts 30, 32, 26 in dielectric material 28. The silicide process will form the silicide contacts 26 on each of the collector 18, emitter 20 and base 22, in addition to the dummy gate structures 24. As should be understood by those of skill in the art, the silicide process begins with deposition of a thin transition metal layer, e.g., nickel, cobalt or titanium, over fully formed and patterned semiconductor material (e.g., collector 18, emitter 20 and base 22 and dummy gate structures 24). After deposition of the material, the structure is heated allowing the transition metal to react with exposed silicon (or other semiconductor material as described herein) forming a low-resistance transition metal silicide, e.g., NiSi. Following the reaction, any remaining transition metal is removed by chemical etching, leaving silicide contacts 26.

The contacts 30, 32 may be formed by conventional lithography, etching and deposition processes, where the formation of the contact 25 is described in more detail below. It should be understood the contacts 30, 32 may be offset from one another, e.g., provided in a different cross-sectional plane, as shown in a top view of FIG. 2, with both the contacts 30, 32 shown in FIG. 1 being provided for convenience of this description. The contacts 30, 32 may be formed, for example, by first depositing interlevel dielectric material 28 over the structure, followed by a lithography and etching process to form trenches to the silicide 26 of the emitter 20 and the base 22. A conductive material, e.g., tungsten, aluminum or copper, with a liner (e.g., TiN), may be deposited within the trenches in contact with the silicide contacts 26. Any residual material may be removed from the interlevel dielectric material 28 by a conventional CMP process.

Figure 2:
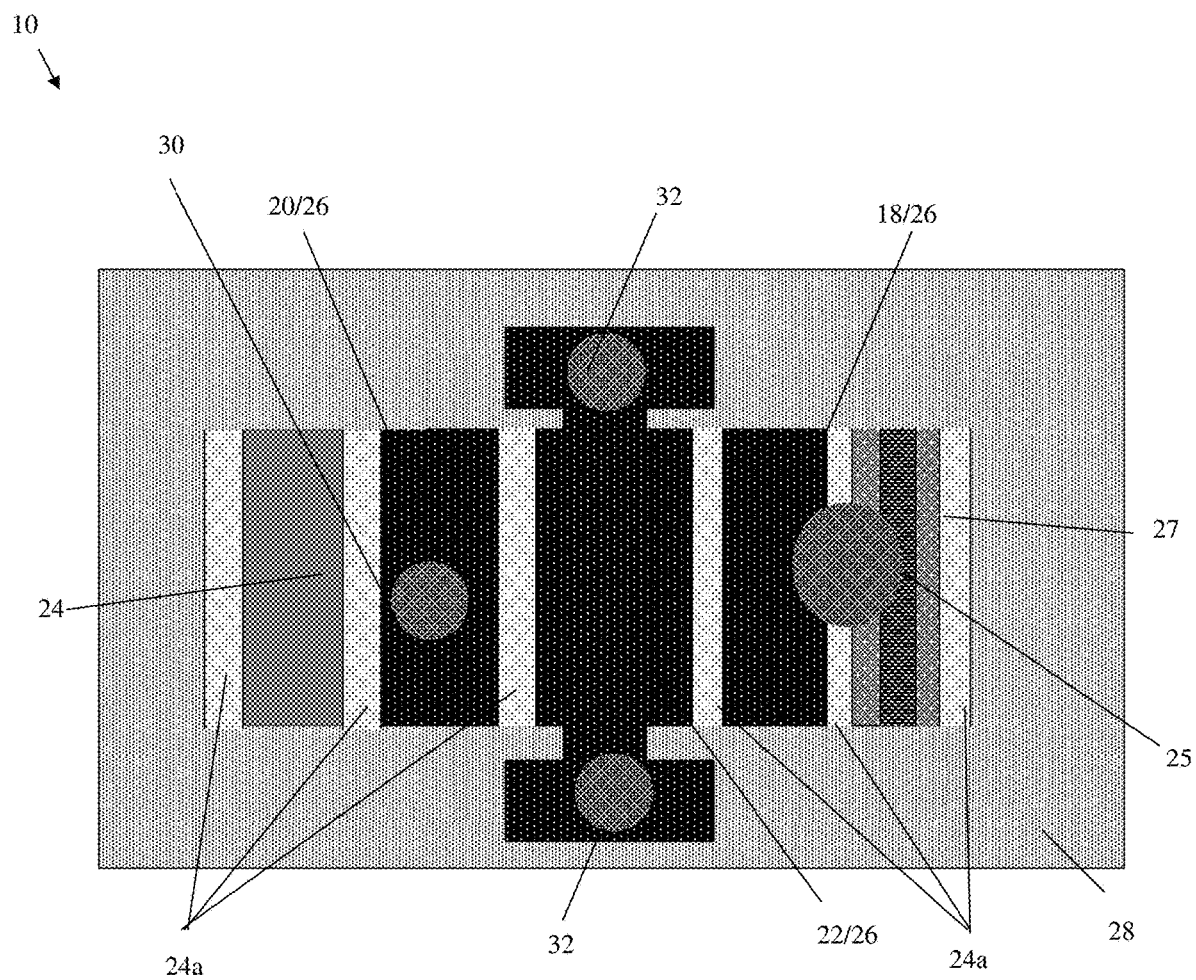
FIG. 2 shows a top cross-sectional view of the lateral heterojunction bipolar transistor of FIG. 1.

FIG. 2 shows a top cross-sectional view of the structure 10 of FIG. 1. As shown in this representation, the collector contact 25 extends over and contacts (directly) the silicide contact 26 of the collector 18. In addition, the collector contact 25 extends over both sidewall spacers 24a, 27, with part of the collector contact 25 being surrounded by the spacers 24a, 27. The collector contact 25 also extends a length of the dummy gate structure (i.e., the removed dummy gate structure structure). In this way, the collector contact 25 has an increased surface area contacting the underlying handle wafer which, in turn, provides for an increased thermal pathway for heat to be removed from the structure. That is, the increased surface area of the collector contact 25 will improve self-heating and heat dissipation, in addition to providing improved thermal conductivity.

Moreover, the collector 18, emitter 20 and base 22 are separated and isolated from one another by the sidewall spacers 24a. Further, the contacts 32 for the base 22 are not in the same plane as the contacts 20, 25 for the collector 18 and the emitter 20. This arrangement provides improved capacitance. In addition, the contact 30 only contacts the emitter 20 (e.g., silicide contact 26 of emitter 20). Similarly, the contact 32 only contacts the base 22 (e.g., silicide contact 26 of base 22). The contacts 30, 32, 25 may be tungsten, aluminum or copper, which further contributes to a thermal conduction pathway attributed to the collector contact 25.

Figure 3A:
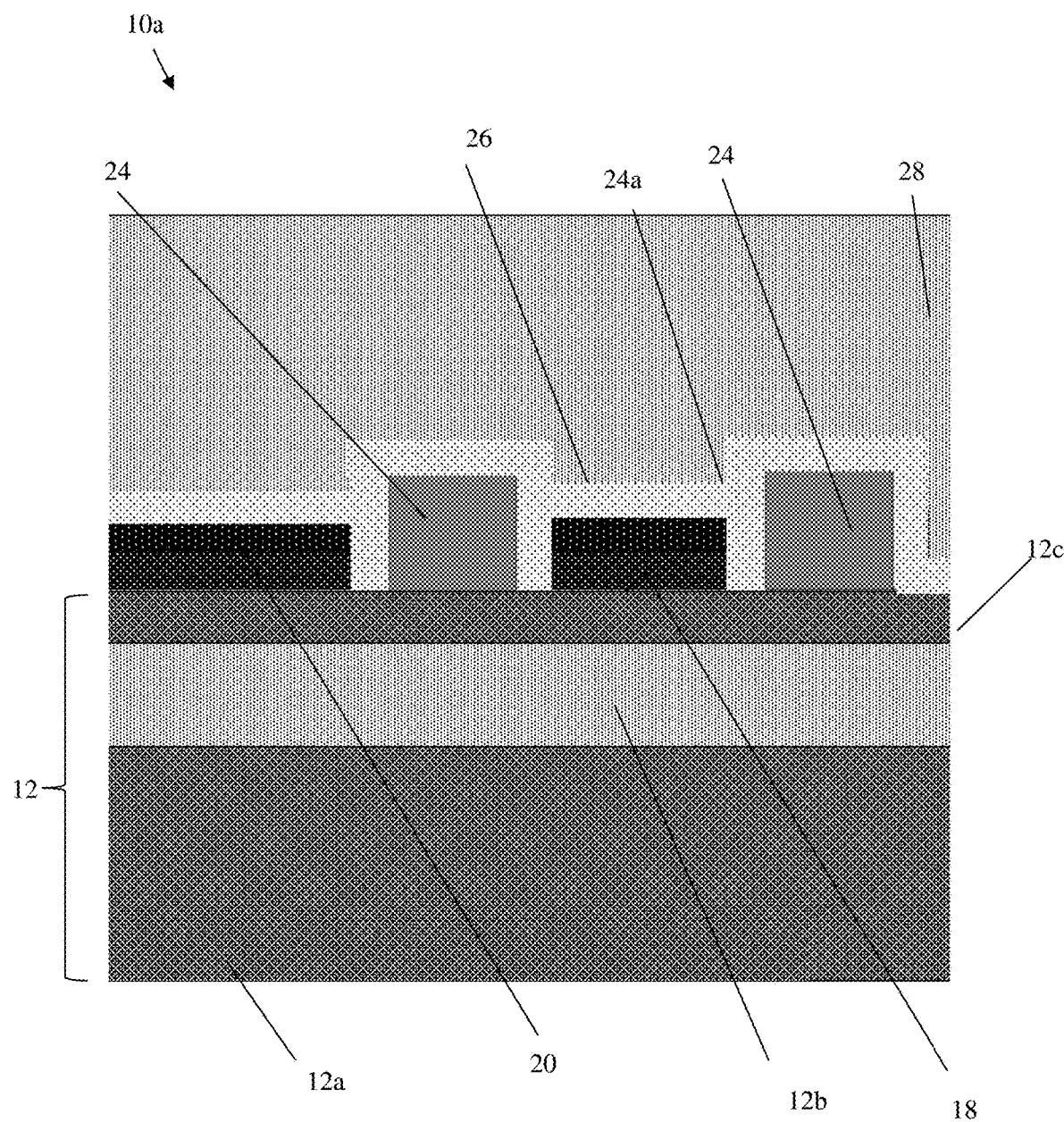
FIGS. 3A-3F show fabrication processes for manufacturing a collector contact for a lateral heterojunction bipolar, amongst other features, in accordance with aspects of the present disclosure.

FIGS. 3A-3F show fabrication processes for manufacturing a collector contact, amongst other features, in accordance with aspects of the present disclosure. In embodiments, FIG. 3A shows a middle of the line module 10a. The middle of the line module 10a includes, for example, at least one dummy gate structure 24 with sidewall spacers 24a. In this representation, the sidewalls spacers 24a may include nitride and/or oxide material that completely lines the dummy gate structure 24, in addition to any exposed surfaces. The dummy gate structures 24 may comprise polysilicon material deposited by CVD processes and patterned by lithography and etching processes as already described herein. The dummy gate structures 24 may be formed on the semiconductor substrate 12c. A dielectric material 28 may be deposited on the dummy gate structures 24 using conventional deposition processes, e.g., CVD. The dielectric material 28 may include alternating layers of oxide and nitride, as an example.

Figure 3B:
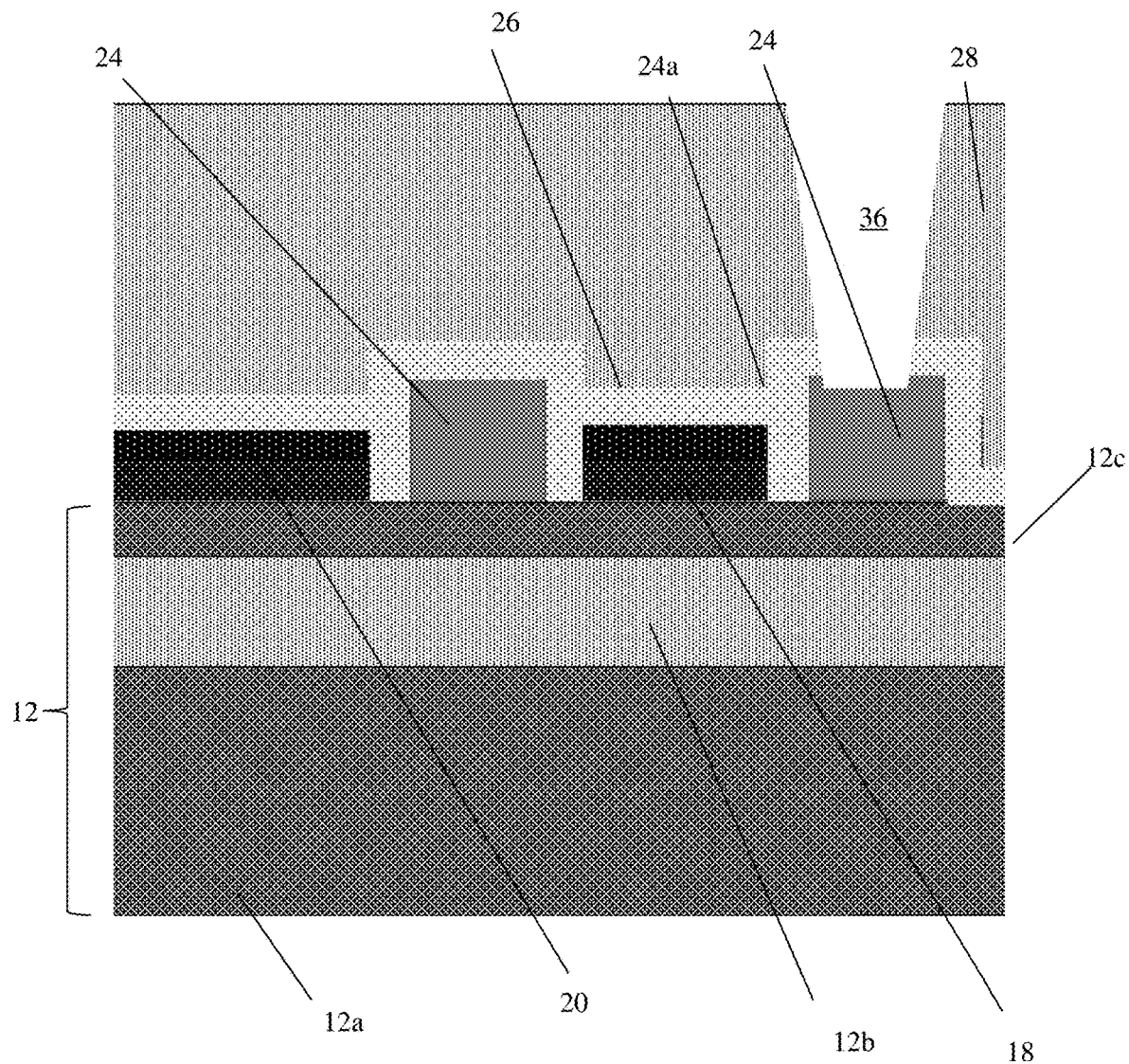

In FIG. 3B, a single diffusion break (e.g., trench) 36 may be formed in the dielectric material 28, extending through the material of the sidewall spacer 24a and exposing the underlying dummy gate structure 24. In embodiments, the single diffusion break 36 may be formed by conventional lithography and etching methods known to those of skill in the art. For example, a resist formed over the dielectric material 28 is exposed to energy (light) and developed utilizing a conventional resist developer to form a pattern (opening). An etching process with a selective chemistry, e.g., RIE, will be used to transfer the pattern from the resist layer to the dielectric material 28 and through the material of the sidewall spacers 24a. The resist may be removed by a conventional oxygen ashing process or other known stripants.

Figure 3C:
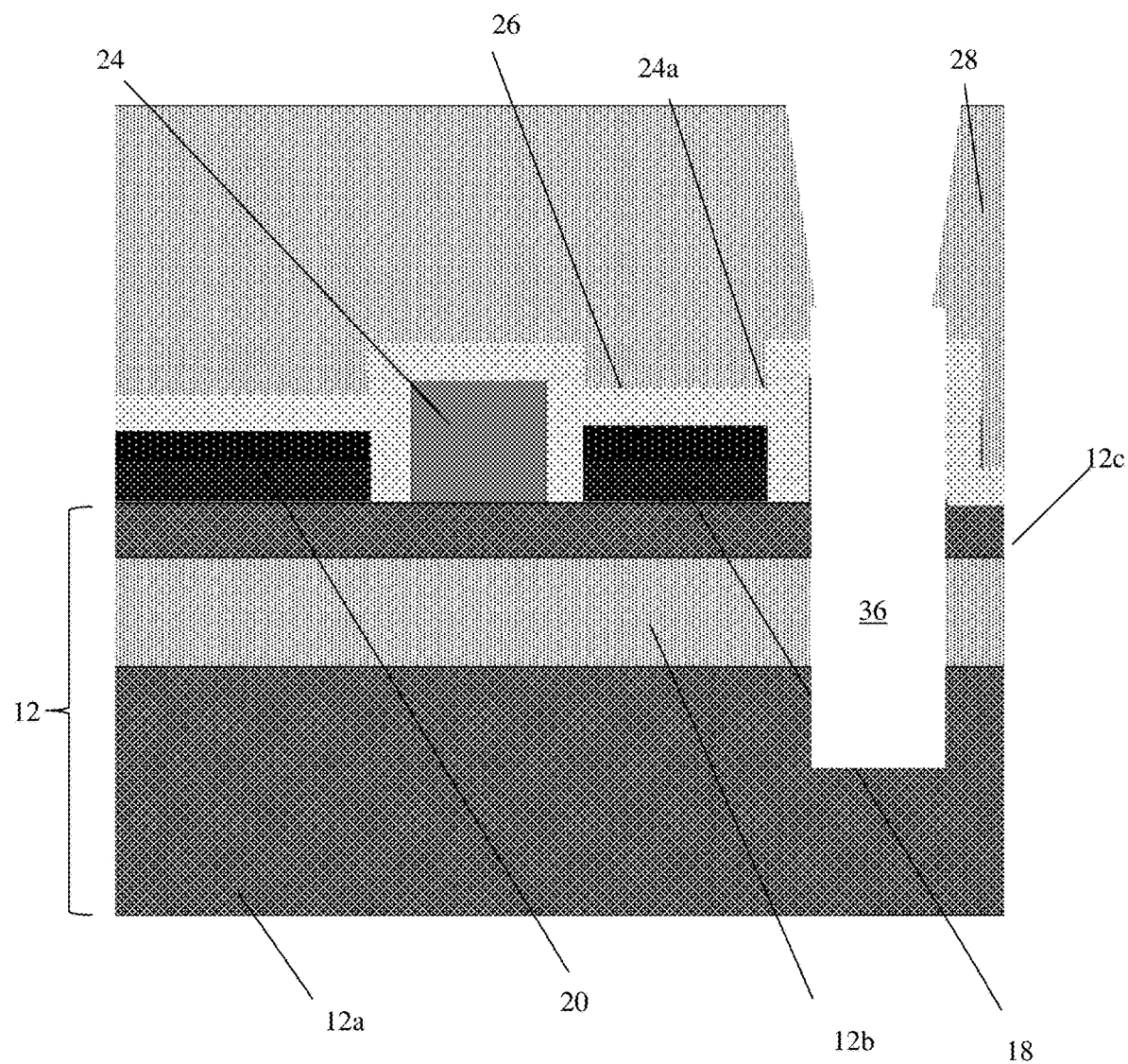

In FIG. 3C, the single diffusion break (e.g., trench) 36 is extended through the dummy gate structure 24, the semiconductor substrate 12c and the insulator layer 12b, extending within the handle wafer 12a. In embodiments, the extension of the single diffusion break (e.g., trench) 36 requires a dummy polysilicon etching process, in addition to etch chemistries that etch through the semiconductor substrate 12c, the insulator layer 12b, and partly within the handle wafer 12a. In embodiments, this etching process can be a timed etch to ensure that the single diffusion break (e.g., trench) 36 extends to within the handle wafer 12a. Also, as shown, the single diffusion break (e.g., trench) 36 will be provided between the sidewall spacers 24a, e.g., leaving the sidewalls spacers 24a intact, while removing the material of the sidewall spacers 24a on top of the dummy gate structure 24 and the dummy gate structure 24, itself.

Figure 3D:
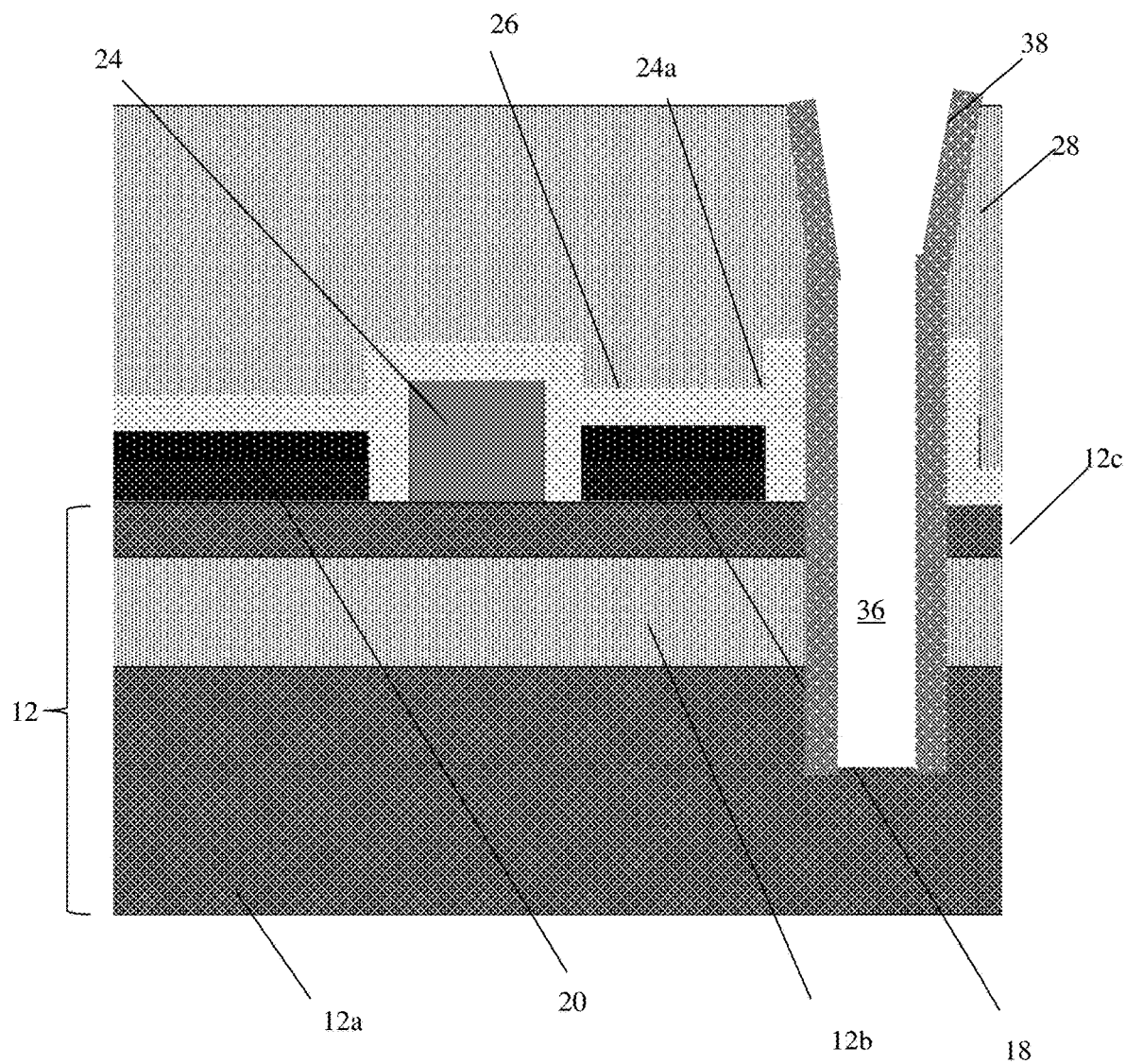

In FIG. 3D, a liner 38 may be deposited on sidewalls of the single diffusion break (e.g., trench) 36. In embodiments, the liner 38 may be provided on the sidewall spacers 24a, the semiconductor substrate 12c, the insulator layer 12b and the handle wafer 12a. The liner 38 may be an insulator material, e.g., a nitride material or other low-k dielectric material, deposited by a conventional deposition method. The liner 38 may be removed from the bottom surface of the trench 36 and top surface of the dielectric material 28 by a known anisotropic etching process. In embodiments, the liner 38 or any residual portions of the liner 38 on the top surface of the dielectric material 28 may be removed by a CMP process.

Figure 3E:
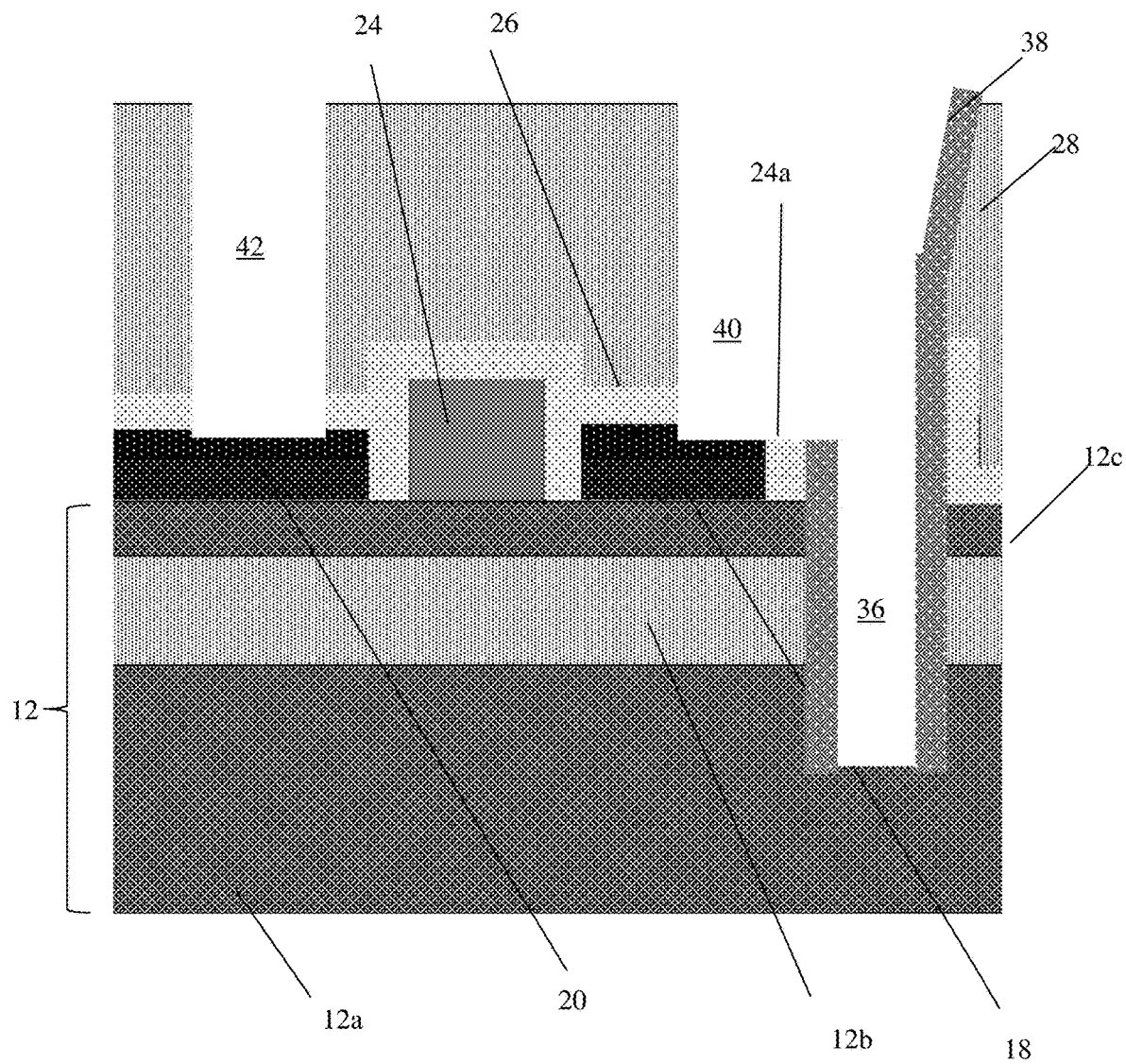

In FIG. 3E, an additional trench 40 may be formed over the collector 18. In embodiments, the trench 40 may merge with the single diffusion break (e.g., trench) 36 to form a single trench structure, e.g., single diffusion break. The additional trench 40 may be formed by conventional etching processes, which will remove portions of the liner 38 and the dielectric material 28. In embodiments, the additional trench 40 will expose the silicide 26 of the collector 18. Moreover, a trench 42 may be formed in the dielectric material 26, which exposes the silicide 26 of the emitter 20. The trench 42 may also be formed by a conventional etching process. Although not shown a trench may be formed to the base in a similar manner.

Figure 3F:
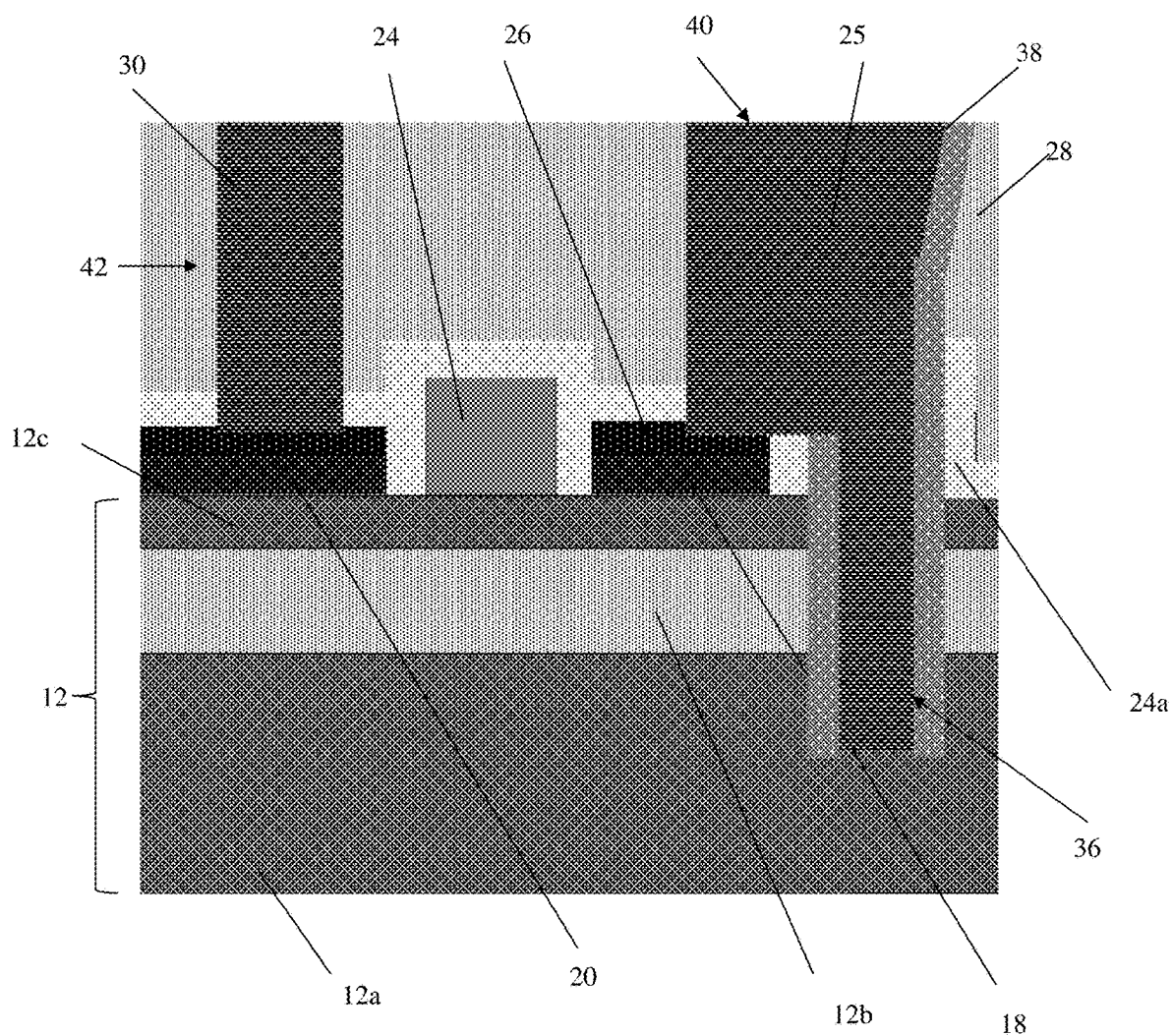

In FIG. 3F, the collector contact 25 may be formed within the trenches 36, 42 and the contact 30 may be formed in the trench 42. The collector contact 25 lands on both the silicide 26 of the collector 18 and on the handle wafer 12a through the trenches 36, 40 (e.g., single diffusion break). The contact 30 may be the emitter contact which lands on the silicide 26 of the emitter 20. The contacts 25, 30 may include a liner material, e.g., TiN or TaN, in addition to a metal material, e.g., tungsten, aluminum or copper. The material of the contacts 25, 30 may be deposited by a CVD process, followed by a planarization process (e.g., CMP) to remove any residual or excess material from a top surface of the dielectric material 28.

The lateral heterojunction bipolar transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a lateral bipolar transistor comprising an emitter, a base and a collector;
   an emitter contact to the emitter;
   a base contact to the base; and
   a collector contact to the collector and extending to an underlying semiconductor substrate underneath the collector.

2. The structure of claim 1, wherein the emitter comprises a raised emitter, the base comprises a raised base and the collector comprises a raised collector, each of which comprise semiconductor material.

3. The structure of claim 1, wherein the underlying semiconductor substrate comprises a semiconductor handle substrate which supports a buried insulator layer and a semiconductor substrate on top of the semiconductor handle substrate.

4. The structure of claim 3, wherein the collector contact extends through the buried insulator layer and semiconductor substrate.

5. The structure of claim 4, further comprising a first spacer surrounding the collector contact.

6. The structure of claim 5, further comprising a second spacer surrounding the collector contact and the first spacer.

7. The structure of claim 6, further comprising a spacer surrounding the base and which isolates the base from the collector and the emitter.

8. The structure of claim 6, wherein a portion of the collector contact extends over the first spacer and the second spacer.

9. The structure of claim 6, wherein the first spacer extends into a well of the semiconductor handle substrate.

10. The structure of claim 1, wherein the collector contact directly contacts silicide on the collector and comprises a width dimension greater than the emitter contact and the base contact.

11. The structure of claim 1, wherein the collector comprises a raised collector comprising epitaxial semiconductor material, and the collector contact contacts the raised collector on a top surface and extends into the underlying semiconductor substrate at a side of the raised collector.

12. A structure comprising:
    a substate comprising a semiconductor handle substrate, an insulator material on the semiconductor handle substrate and a semiconductor material on the insulator material;
    a lateral bipolar transistor comprising a collector, an emitter and a base;
    an emitter contact to the emitter;
    a base contact to the base; and
    a collector contact to the collector and extending to the semiconductor handle substrate, through the insulator material and the semiconductor material.

13. The structure of claim 12, wherein the collector contact extends to a well in the semiconductor handle substrate.

14. The structure of claim 12, further comprising a first spacer surrounding the collector contact above the semiconductor material.

15. The structure of claim 14, further comprising a second spacer surrounding the base and extending into the semiconductor handle substrate, wherein the first spacer also surrounds the second spacer.

16. The structure of claim 15, wherein the collector contact extends over the first spacer and the second spacer to contact the collector.

17. The structure of claim 14, further comprising a spacer about the base and which isolates the base from both the collector and the emitter.

18. The structure of claim 14, wherein the collector comprises a raised collector comprising epitaxial semiconductor material and the collector contact contacts a top surface of the raised collector and extends on a side surface of the raised collector.

19. The structure of claim 14, wherein the collector contact extends below the emitter and the base.

20. A method comprising:
    forming a lateral bipolar transistor comprising an emitter, a base and a collector;
    forming an emitter contact to the emitter;
    forming a base contact to the base; and
    forming a collector contact to the collector and extending to an underlying semiconductor substrate underneath the collector.

* * * * *